United States Patent
Flores-Cuadras et al.

(10) Patent No.: US 8,810,457 B2
(45) Date of Patent: Aug. 19, 2014

(54) ORTHOGONAL MODULAR EMBEDDED ANTENNA, WITH METHOD OF MANUFACTURE AND KITS THEREFOR

(75) Inventors: Javier Ruben Flores-Cuadras, Tijuana (MX); Jose Eleazar Zuniga-Juarez, Ensenada (MX)

(73) Assignee: Taoglas Group Holdings, Enniscorthy (IE)

( * ) Notice: Subject to any disclaimer, the term of this patent is extended or adjusted under 35 U.S.C. 154(b) by 186 days.

(21) Appl. No.: 13/489,568

(22) Filed: Jun. 6, 2012

(65) Prior Publication Data
US 2012/0326943 A1    Dec. 27, 2012

Related U.S. Application Data

(60) Provisional application No. 61/500,768, filed on Jun. 24, 2011.

(51) Int. Cl.
*H01Q 1/38* (2006.01)
(52) U.S. Cl.
USPC .................................. 343/700 MS; 343/848
(58) Field of Classification Search
CPC ............ H01Q 1/38; H01Q 1/48; H01Q 1/243
USPC .......................................... 343/700 MS, 848
See application file for complete search history.

(56) References Cited

U.S. PATENT DOCUMENTS

| | | | | |
|---|---|---|---|---|
| 6,809,687 | B2 * | 10/2004 | Yuanzhu | 343/700 MS |
| 7,106,253 | B2 * | 9/2006 | Yuanzhu | 343/700 MS |

\* cited by examiner

*Primary Examiner* — Tan Ho
(74) *Attorney, Agent, or Firm* — Shartsis Friese LLP; Cecily Anne O'Regan (57) ABSTRACT

Described herein are antenna designs and configurations that provide flexible solutions for creating compact antennas with multiple-band capabilities. For example, a hybrid PIFA-monopole antenna configuration and design is described. As another example, non-planar (e.g., orthogonal) and composite radiating structures incorporating various radiating element and ground plane configurations are described. Connective structures are also described for providing physical rigidity and ground plane connectivity to composite radiation elements. In embodiments described herein of composite radiating structures, multiple antennas may be included through passive radiating elements potentially combined with active circuitry. Composite radiating structures with multiple antennas may be used in multiple-in and multiple-out (MIMO) antenna applications. For example, multiple different antennas within the composite radiating structures may be created using radiating elements on one or more of the vertical and/or horizontal portions of the composite radiating structure.

20 Claims, 5 Drawing Sheets

ORTHOGONAL MODULAR EMBEDDED ANTENNA, WITH METHOD OF MANUFACTURE AND KITS THEREFOR

CROSS-REFERENCE

This application claims the benefit of U.S. Provisional Application No. 61/500,768, filed Jun. 24, 2011, entitled Orthogonal Modular Embedded Antenna, with Method of Manufacture and Kits Therefor, which application is incorporated herein by reference.

BACKGROUND OF THE INVENTION

1. Field of the Invention

The present disclosure relates to compact antenna configurations.

2. Background of the Invention

In recent years there has been a tremendous increase in the use of wireless devices for new complex applications. As a result, new wireless frequency standards continue to emerge throughout the world and new techniques of antenna implementations.

SUMMARY OF THE INVENTION

Described herein are antenna designs and configurations that provide flexible solutions for creating compact antennas with multiple-band capabilities. For example, a hybrid PIFA-monopole antenna configuration and design is described. As another example, non-planar (e.g., orthogonal) and composite radiating structures incorporating various radiating element and ground plane configurations are described. Connective structures are also described for providing physical rigidity and ground plane connectivity to composite radiation elements. In embodiments described herein of composite radiating structures, multiple antennas may be included through passive radiating elements potentially combined with active circuitry. Composite radiating structures with multiple antennas may be used in multiple-in and multiple-out (MIMO) antenna applications. For example, multiple different antennas within the composite radiating structures may be created using radiating elements on one or more of the vertical and/or horizontal portions of the composite radiating structure.

The disclosure describes a composite resonating antenna structure including a first substrate having a through-hole and a first conductive layer comprising a first resonating element connected to the through-hole. The composite resonating structure further includes a second substrate having a mounting pad capable of connecting with the through-hole in a configuration such that the first substrate and the second substrate are in an orthogonal configuration. The composite resonating structure further includes a second conductive layer attached to the second substrate, the second conductive layer shaped to include a ground plane section and a signal transmission line capable of carrying microwave frequency signals including a center frequency, wherein the first resonating element is capable of radiating a frequency equal to the center frequency based on the orthogonal configuration.

The disclosure also describes an antenna kit including a plurality of substrates include a plurality of resonating elements. The antenna kit further includes a first substrate of the plurality of substrates having a through-hole and a first conductive layer comprising a first resonating element connected to the through-hole. The antenna kit further includes a second substrate of the plurality of substrates having a mounting pad capable of connecting with the through-hole in a configuration such that the first substrate and the second substrate are in an orthogonal configuration. The antenna kit further includes a second conductive layer attached to the second substrate, the second conductive layer shaped to include a ground plane section and a signal transmission line capable of carrying microwave frequency signals including a center frequency, wherein the first resonating element is capable of radiating a frequency equal to the center frequency based on the orthogonal configuration.

An aspect of the disclosure is directed to a composite resonating antenna structure. The antenna structure comprises: a first substrate having a through-hole and a first conductive layer comprising a first resonating element connected to the through-hole; a second substrate having a mounting pad capable of connecting with the through-hole in a configuration such that the first substrate and the second substrate are in an orthogonal configuration; and a second conductive layer attached to the second substrate, the second conductive layer shaped to include a ground plane section and a signal transmission line capable of carrying microwave frequency signals including a center frequency; wherein the first resonating element is capable of radiating a frequency equal to the center frequency based on the orthogonal configuration. The first resonating element is adaptable and configurable to have the resonant frequency equal to the center frequency further based on an electromagnetic field pattern between the first resonating element of the first substrate and the second conductive layer of the second substrate. Additionally, the first resonating element is adaptable and configurable to a width of from about 1 mm to about 6 mm and a length of from about 3 mm to about 18 mm, or more specifically a width of from about 2 mm to about 10 mm and a length of from about 5 mm to about 45 mm. In at least some configurations, the electromagnetic field pattern is between the first resonating element of the first substrate and the ground plane section of the second conductive layer. Typically, the resonant frequency is a first radiating frequency, wherein the center frequency is a first center frequency, and wherein the first conductive layer further comprises a second resonating element capable of having a second radiating frequency equal to a second center frequency. In some configurations, the second resonating element has a width of from about 1 mm to about 6 mm and a length of from about 3 mm to about 18 mm, or more specifically, a width of from about 2 mm to about 10 mm and a length of from about 5 mm to about 45 mm. In some configurations, the first center frequency is between about 850 MHz and 900 MHz and the second center frequency is between about 1800 MHz and 1900 MHz. Additionally, an antenna can be configured to provide for a third center frequency between about 2110 MHz and 2200 MHz. In some aspects, the orthogonal configuration is a first orthogonal configuration, and wherein the ground plane section is a first ground plane section, the composite resonating antenna structure further comprising a third substrate including a second ground plane section capable of being disposed in a second orthogonal configuration with respect to the first substrate. Moreover, the first resonating element can be capable of having the radiating frequency equal to the center frequency further based on an electromagnetic field pattern between the first resonating element of the first substrate and second ground plane section of the third substrate. Additionally, the second orthogonal configuration is further parallel to the second substrate. The second conductive layer further adaptable and configurable to include a connector for coupling with a coaxial cable. The second conductive layer can be a capacitive stub portion attached to the signal transmission line on the second substrate. Additionally, the mounting pad is adaptable and configurable to fit within the through-hole and form a connection therein. Moreover, the mounting pad is further adaptable and configurable to form a connection with the through-hole via solder connection. The through-hole is also adaptable and configurable to provide multiple metallizations within the first substrate.

A further aspect of the disclosure is directed to antenna kits. Antenna kits are configurable to comprise: a plurality of substrates include a plurality of resonating elements; a first substrate of the plurality of substrates adaptable and configurable to have a through-hole and a first conductive layer comprising a first resonating element connected to the through-hole; a second substrate of the plurality of substrates having a mounting pad capable of connecting with the through-hole in a configuration such that the first substrate and the second substrate are in an orthogonal configuration; and a second conductive layer attached to the second substrate, the second conductive layer shaped to include a ground plane section and a signal transmission line capable of carrying microwave frequency signals including a center frequency; wherein the first resonating element is capable of radiating a frequency equal to the center frequency based on the orthogonal configuration. Kits can further comprise a flexible cable adaptable to connect the planar antenna to a target device.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

The disclosure provides antenna designs, including designs for embodiments of orthogonal radiating element configurations. In several embodiments, the disclosure describes antenna designs with orthogonal configurations for wireless applications such as LTE, GSM, GPRS, EDGE, UMTS, WIFI, GPS, WiMAX, Bluetooth, as well as applications in the unlicensed Industrial, Scientific and Medical bands. Some embodiments include antennas suitable for use in any wireless communication standard which uses the electromagnetic spectrum from 100 MHz up to 18 GHz.

Antenna configurations may include a parallel structure between a radiation element and a ground plane. Some antenna configurations such as IFA (Inverted F Antenna) and PIFA (Planar Inverted F Antenna), and/or monopole microstrip designs include a long ground plane and have a narrow bandwidth. However, as described further herein, some antennas may be designed to cover multiple communication standards which require an extensive bandwidth, high efficiency, and high gain while requiring a small form factor. For example, Penta Band Cellular includes the GSM850, EGSM900, DCS1800, PCS1900 and UMTS2100 frequency bands. With the introduction of the new LTE700 Band in the United State of America, antenna design is further complicated by an additional frequency band.

With the advance in the electronic semiconductor industry, many of the electronic sub-systems have been reduced in size to fit within much smaller physical spaces, leading designers to minimize their product size and at the same time finding new applications or others that becomes feasible due to the reduced device size. As an example, a new tracking system device concept has been created to monitor aspects of vehicle operations in real time, including vehicle driving behavior, real time vehicle operating diagnostics, and fleet management in a way that avoids complex installation of one or more device(s) under the dash. These kinds of tracking systems are known as OBDII Tracking System, which uses the On Board Diagnostic Generation II connector/port of a car as installation. Through this connector, the OBDII Tracking System obtains power, communication with the car computer, and any necessary control of the vehicle.

Because the OBDII port/connector from a car changes from models, brand and year, sometimes the OBDII connector can be close to the pedals, human legs, or can be obstructed by other parts of the car. Therefore, the size of the entire device has to be small (approximately 50×50×30 mm). In addition, the device's antenna has to be efficient. Since the size of the device has been reduced but the operation frequencies of devices are remaining the same or even are reducing to the newly added LTE700 Bands in the United States of America, the required longer wavelengths demand larger physical dimensions or effective physical dimensions in order to radiate energy efficiently.

I. Antennas

Figure 1A:
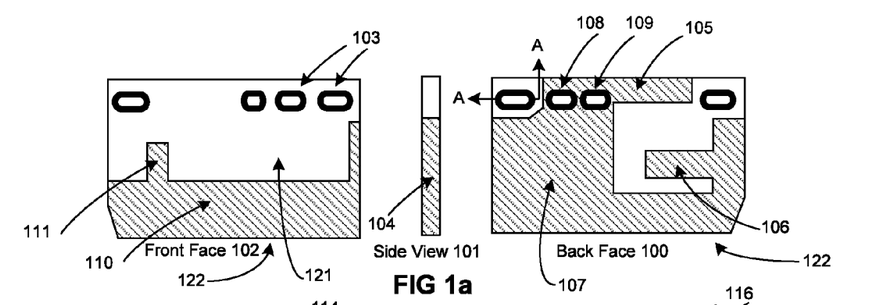
FIGS. 1a-b illustrate an embodiment of a composite radiator structure for assembly in an orthogonal configuration with a single vertical portion and single horizontal portion.
Figure 1B:
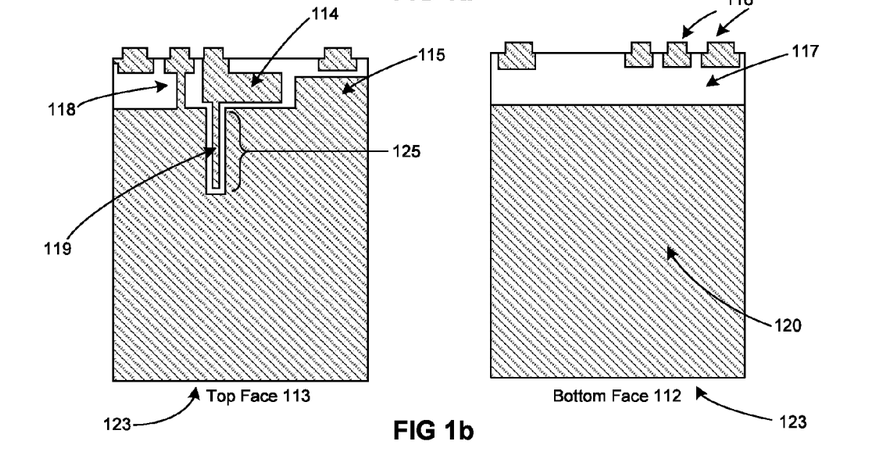

FIGS. 1a-b illustrate an embodiment of a composite radiator structure for assembly in an orthogonal configuration with a single vertical portion and single horizontal portion. FIG. 1a illustrates a "vertical" portion of the composite radiator structure. FIG. 1b illustrates a "horizontal" portion of the composite radiator structure that is capable of being assembled in a non-planar (e.g., orthogonal) configuration with the vertical portion. As described herein, the descriptive terms "vertical" and "horizontal" as applied to portions of the composite radiator structure refer to relative orientations of the portions of the composite radiator structure.

FIG. 1a shows an embodiment of a vertical portion 122 of the composite radiator structure, with a view of the front face 102, the side view 101 and the back face 100. In one embodiment, the vertical portion 122 includes through-holes 103 for assembling the vertical portion with the horizontal portion 123 of the composite radiator structure. For example, through-holes 103 on the vertical portion 122 may be capable of accepting mounting pads 116 from the horizontal portion 123. In one embodiment, mating faces of the vertical portion 122 and the horizontal portion 123 (e.g., surfaces in or around through-holes 103 and/or surfaces on or around the mounting pads 116) may be configured to guide the vertical portion into an orthogonal relationship with the horizontal portion. In another embodiment, such mating faces may be configured to guide the vertical portion 122 into an angular relationship other than orthogonal with the horizontal portion 123.

Each of the vertical portion 122 and the horizontal portion 123 may include a substrate 121, such as a high-frequency substrate of suitable material (e.g., with suitable dielectric constant) for forming antennas (e.g., microstrip-based antennas) for receiving radio waves and/or microwaves. Portions of the substrate 121 may be free of metal and/or other surface features, creating open space on the surface of the substrate between metalized elements (e.g., radiating element 110, capacitive stub 111). In one embodiment, a substrate 121 for the vertical portion 122 and/or the horizontal portion 123 may include dielectric material that ranges from 0.2 to 5 mm in thickness. Materials for the substrate 121 may be chosen for each of the vertical portion 122 and the horizontal portion 123 to achieve specific antenna requirements and sizes required by the application.

In one embodiment, the vertical portion 122 includes multiple radiating elements, each capable of radiating at and around a distinct radiating frequency. In one embodiment, metallizations on the vertical portion 122 may be adapted based on, for example, calculations of impedance between the vertical portion and horizontal portion 123, as well as the frequency requirements for the composite radiator structure. For example, a composite radiator structure including the vertical portion 122 and an associated horizontal portion 123 may be adapted, as described further herein, to center the frequency response of radiator(s) on the composite radiator structure around frequencies corresponding with communications standards. Radiating frequencies of radiating elements may be described herein as relatively higher or lower than each other; however the terms higher and lower may include no absolute reference to a frequency. Further, multiple references to a lower frequency need not refer to the same lower frequency and multiple references to a higher frequency need not refer to the same higher frequency. Measurements of radiating elements, including lengths and widths, are expressed in terms relative to the conventional dimensional references of radiating stubs. For example, the length of a radiating element may appear horizontally or vertically in the Figures, yet a description herein of a radiating element's length refers to the dimension extending away from another element (e.g., a ground plane). Similarly, a width of a radiating element may appear horizontally or vertically in the Figures, yet a description of the same refers to a dimension perpendicular to the radiating element's length.

As shown by vector representations (A) on the vertical portion 122, in one embodiment, the interconnection 104 may connect the radiating element 110 with the capacitive coupling element 107 across the full height of each element 110 and 107 at the point where each element meets an edge of the front face and back face, respectively, of the vertical portion. For example, the interconnection 104 may include a planar metal portion spanning from the front face of the vertical portion 122 to the back face of the vertical portion across the outside surface of the vertical portion. As another example, the interconnection 104 may include portions disposed through the substrate 121 between the front face and the back face of the vertical portion 122.

In one embodiment, the vertical portion 122 includes a radiating element 110. The radiating element 110 may be adapted for increasing efficiency of lower frequency operation. In one embodiment, the radiating element 110 ranges from 2 to 20 mm in width and from 10 to 48 mm in length.

In one embodiment, the vertical portion 122 includes a capacitive stub 111 connected to the radiating element 110. The capacitive stub 111 may be capable of tuning lower frequency operation. For example, in one embodiment, the position and/or shape (e.g., a polygon) of the capacitive stub 111 may be modified from those shown in FIG. 1a to create different effects on the impedance of the lower frequency signal traces of the composite radiating structure.

The vertical portion 122 may include an interconnection 104 between the front face of the vertical portion and the back face of the vertical portion, for example, to connect the radiating element 110 on the front face with a capacitive coupling element 107 on the back face. In one embodiment, the capacitive coupling element 107 is capable of coupling with ground plane on the horizontal portion 123, as described further herein.

In one embodiment, the vertical portion 122 includes a radiating element 106 that is capable of operating at a lower frequency and that is disposed on the back face of the vertical portion. In one embodiment, the radiating element 106 ranges from 2 to 10 mm in width and ranges from 5 to 20 mm in length.

In one embodiment, the vertical portion 122 includes a radiating element 105 that is capable of operating at a higher frequency and that is disposed on the back face of the vertical portion. In one embodiment, the radiating element 105 ranges from 2 to 5 mm in width and ranges from 5 to 18 mm in length.

Through-holes 103 may be positioned and adapted for use both as physical support and connection as well as electrical connection. In one embodiment, some through-holes 103, such as through-hole 124, are configured and positioned to provide physical support without electrical connection between the vertical portion 122 and the horizontal portion 123. For example, the through-hole 124 is not directly electrically connected to either a signal trace or a ground trace/plane of the vertical portion 122. As another example, mounting pad 116 is not directly electrically connected to either a signal trace or a ground trace/plane of the horizontal portion 123. In one embodiment, the through-hole 124 and/or its associated mounting pad 116 is metalized to provide for a soldered connection between them. For example, the through-hole 124 and its associated mounting pad 116 may be formed similarly to through-holes 103 and mounting pads 116 that are connected to signal or ground metallizations. As another example, through-holes 103 and mounting pads 116 that do not have direct electrical connections to either signal or ground metallizations may be metalized, but in a different manner than through-holes and mounting pads that are connected to signal or ground metallizations.

FIG. 1b shows an embodiment of a horizontal portion 123 of the composite radiator structure, with a view of the top face 113 and the bottom face 112. In one embodiment, as described further herein, the horizontal portion 123 includes mounting pads 116 for assembling the horizontal portion with the vertical portion 122 of the composite radiator structure. The horizontal portion may include a ground plane portion 120 on the bottom face 123. In one embodiment, the ground plane portion 120 is connected to a ground plane portion 115 on the top face of the horizontal portion 123, including an extension portion of the ground plane that extends beyond the ground plane's regular rectangular shape. The ground plane portion 115 may be adapted through this extension for open-circuit tuning of high frequency operation. In one embodiment, the ground plane portion 115 ranges from 2 to 7 mm in width (i.e., horizontal dimension in FIG. 1b) and from 5 to 15 mm in length (i.e., vertical dimension in FIG. 1b).

In one embodiment, a connection 119 is included in co-planer relation to the ground plane portion 115 on the top face of the horizontal portion 123. The connection 119 may be capable of connecting with any suitable signal transmitter for the antenna, such as a coaxial cable connection. In one embodiment, the connection 119 forms a waveguide transmission line in relation with the ground plane portion 115 and/or the ground plane portion 120, including a length 125 of micro-strip transmission line flanked on one or both sides by the ground plane portion 115.

In one embodiment, the transmission line of the connection 119 is connected to a capacitive stub 114 on the top face of the horizontal portion 123. The capacitive stub 114 may be capable of increasing bandwidth of lower frequency operation, such as providing capacitance between the capacitive stub and the ground plane portion 115 and/or between the capacitive stub and other grounded portions of the composite radiating structure, as described further herein. For example, the capacitive stub 114 may provide capacitance between the capacitive stub and a ground plane connection 118 on the horizontal portion 123 and/or between the capacitive stub and the capacitive element 107 on the vertical portion 122. In one embodiment, the capacitive stub 114 ranges from 3 to 6 mm in width and from 5 to 12 mm in length. For example, in one embodiment, the position and/or shape (e.g., a polygon) of the capacitive stub 114 may be modified from those shown in FIG. 1b to create different effects on the impedance signal traces of the composite radiating structure.

In one embodiment, a ground plane connection 118 is provided between the ground plane portion 115 and a mounting pad 116. The ground plane connection 118 may be capable of controlling its impedance and coupling with both the mounting pad 116 and the capacitive coupling element 107 of the vertical portion 122. As described further herein, area(s) clear of metallization (e.g., area 117) on the substrate 121 of either the horizontal portion 123 or the vertical portion 122 of the composite radiating structure may be capable of adjusting efficiency and bandwidth of the composite radiating structure.

In one embodiment, one or both of the ground plane portion 115 and the ground plane portion 120 of the horizontal portion 123 of the composite radiating structure may be capable of making room for circuitry (e.g., discrete components, communication modules, microprocessors, memories, clocks, lumped components, transistors, amplifiers, connectors, sensors). For example, ground plane portion(s) 115 and 120 may include sections surrounding circuit elements (not shown) mounted on either the top face or bottom face of the horizontal portion 123 and signal traces connected to the circuit elements may be contained within the substrate 121, such as on inner layers of the substrate. As another example, as described further herein, a ground plane portion 115 and/or 120 may be positioned on an inner layer of the substrate 121 (e.g., within the substrate, below either the top or bottom face of the horizontal portion 123).

Figure 2:
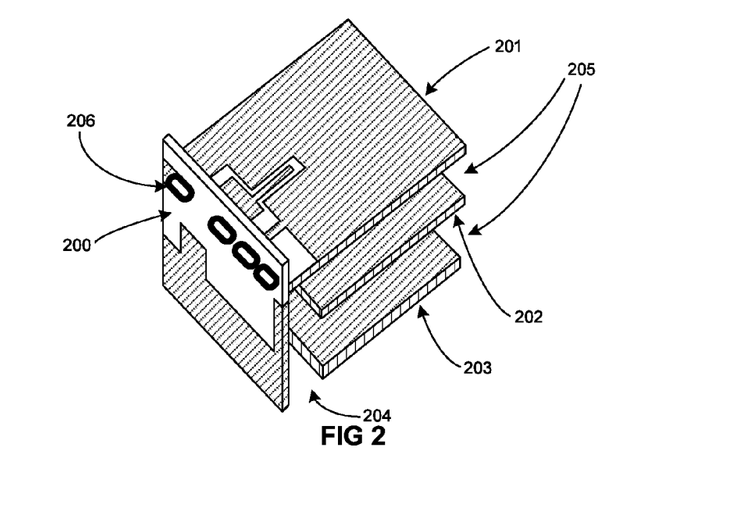
FIG. 2 illustrates an embodiment of a composite radiator structure including a single vertical portion as assembled with multiple optional horizontal portions.

FIG. 2 illustrates an embodiment of a composite radiator structure including a single vertical portion as assembled with multiple horizontal portions. A vertical portion 200 is connected via through-holes, as described further herein, to a first horizontal portion 201 of the composite radiator structure. A second horizontal portion 202 may be connected to the first horizontal portion 201 such that there is free space 204 between the vertical portion 200 and a proximal edge of the second horizontal portion. Capacitive coupling across the free space 204 between metallization(s) on the second horizontal portion 202 and the vertical portion 200 may be adapted based on impedance calculations. The second horizontal portion 202 may be connected to the first horizontal portion 201 such that there is a free space 205 between the first horizontal portion and the second horizontal portion. Capacitive coupling across the free space 205 between metallization(s) on the second horizontal portion 202 and the first horizontal portion 201 may be adapted based on impedance calculations.

As described further herein, multiple horizontal portions may include ground plane portions and/or radiator portions to implement or integrate other frequency bands and/or antenna technologies into the composite radiator structure.

In one embodiment, the composite radiator structure includes a third horizontal portion 203 connected to the second horizontal radiator portion 202. In another embodiment, the third horizontal portion 203 connects directly with the second horizontal portion 202. The third horizontal portion 203 may be connected to the second horizontal portion 202 and/or the first horizontal portion 201 such that there is free space 204 between the vertical portion 200 and a proximal edge of the third horizontal portion. Capacitive coupling across the free space 204 between metallization(s) on the third horizontal portion 203 and the vertical portion 200 may be adapted based on impedance calculations. The third horizontal portion 203 may be connected to the second horizontal portion 202 and/or the first horizontal portion 201 such that there is a free space 205 between the third horizontal portion and the first and second horizontal portions. Capacitive coupling across the free space 205 between metallization(s) on the third horizontal portion 203 and the first and second horizontal portions 201, 202 may be adapted based on impedance calculations.

In one embodiment, optional circuitry components described further herein on horizontal portions 201, 202, 203 may affect capacitive coupling between the horizontal portions, including through dictating minimum dimensions of free spaces 204 and 205. Free space 204 and/or free space 205 may be filled with vacuum, air, or another dielectric material or materials, allowing for further tuning of coupling and/or impedance of connections between the vertical portion 200 and horizontal portions 201, 202, and 203.

Figure 3A:
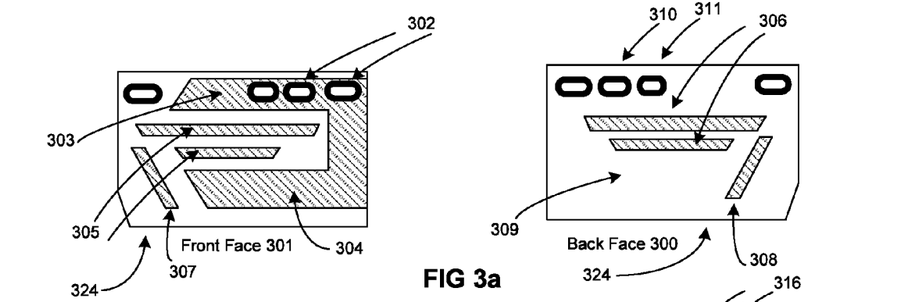
FIGS. 3a-c illustrate an embodiment of a composite radiator structure for assembly in an orthogonal configuration with a single vertical portion and two horizontal portions.
Figure 3B:
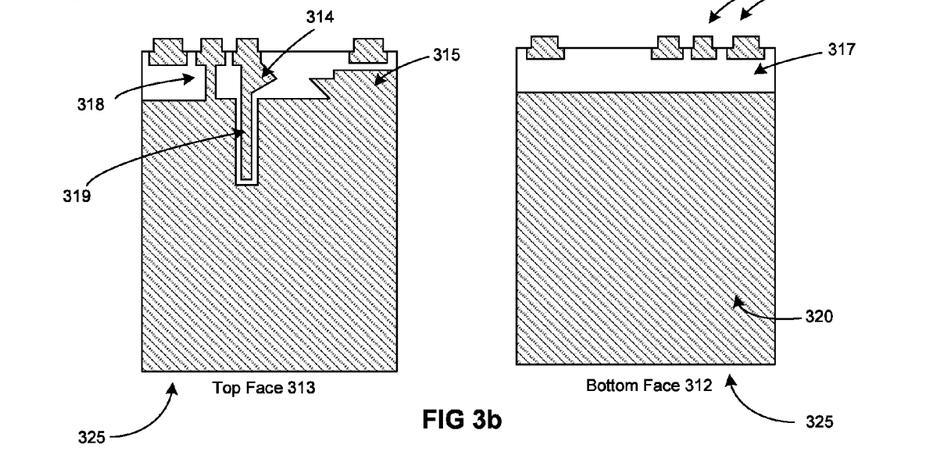
Figure 3C:
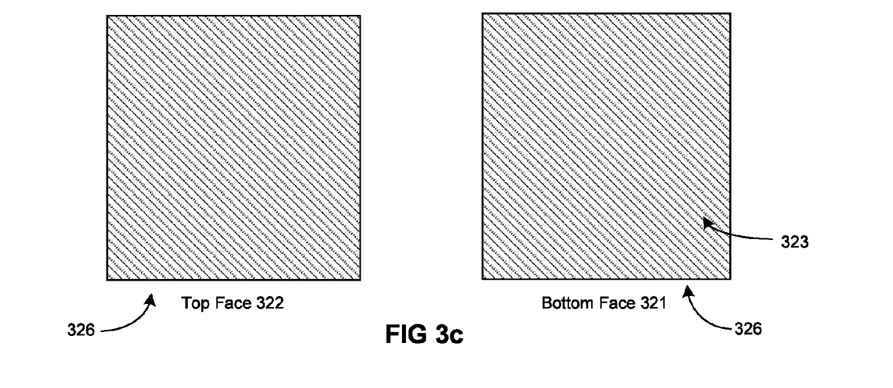

FIGS. 3a-c illustrate an embodiment of a composite radiator structure for assembly in an orthogonal configuration with a single vertical portion 324 and two horizontal portions 325, 326. FIG. 3a illustrates a vertical portion 324 of the composite radiator structure. FIG. 3b illustrates a first horizontal portion 325 of the composite radiator structure that is capable of being assembled in a non-planar (e.g. orthogonal) configuration with the vertical portion 324. FIG. 3c illustrates a second horizontal portion 326 of the composite radiator structure that is capable of being assembled in a non-planar (e.g., orthogonal) configuration with the vertical portion.

FIG. 3a shows an embodiment of a vertical portion 324 of the composite radiator structure, with a view of the front face 301 and the back face 300. In one embodiment, the vertical portion 324 includes through-holes 302, 310, 311 for assembling the vertical portion with the first horizontal portion 325 of the composite radiator structure. For example, through-holes 302, 310, 311 on the vertical portion 324 may be capable of accepting mounting pads 316 from the first horizontal portion 324. Through-holes 302, 310, 311 may be positioned and adapted for use both as physical support and connection as well as electrical connection, as described further herein. Connections between the vertical portion 324 and the first horizontal portion 325 may be adapted as described further herein. Each of the vertical portion 324 and the first and second horizontal portions 325, 326 may include a substrate 309, as described further herein.

In one embodiment, the vertical portion 324 includes multiple radiating elements, each capable of radiating at and around a distinct radiating frequency, as described further herein. In one embodiment, metallizations on the vertical portion 324 may be adapted based on, for example, calculations of impedance between the vertical portion, the first horizontal portion 325, and the second horizontal portion 326, as well as the frequency requirements for the composite radiator structure.

In one embodiment, the vertical portion 324 includes a radiating element 303. The radiating element 303 may be adapted for higher frequency operation. In one embodiment, the radiating element 303 ranges from 1 to 6 mm in width and from 3 to 10 mm in length.

In one embodiment, the vertical portion 324 includes a radiating element 304. The radiating element 304 may be adapted for lower frequency operation. In one embodiment, the radiating element 304 ranges from 2 to 10 mm in width and from 5 to 45 mm in length.

As one example, parasitic radiating elements 305, 307 which are not connected electrically to either ground or signal portions of metallizations, may be included on the front face 301 as either bandwidth-increasing parasitic radiating elements 305 or gain-increasing parasitic radiating elements 307. Similar parasitic radiating elements 306, 308 which are not connected electrically to either ground or signal portions of metallizations, may be included on the back face 300 as either bandwidth-increasing parasitic radiating elements 306 or gain-increasing parasitic radiating elements 308. Parasitic radiating elements 306, 308 on the back face 300 may be positioned in spaced relationship with (e.g., flanking the planes of, at angle(s) to) the adjacent edges of the first and/or second horizontal portions 325, 326.

FIG. 3b shows an embodiment of a first horizontal portion 325 of the composite radiator structure, with a view of the top face 313 and the bottom face 312. In one embodiment, as described further herein, the horizontal portion 325 includes mounting pads 316 for assembling the horizontal portion with the vertical portion 324 of the composite radiator structure. The first horizontal portion 325 may include a ground plane portion 320 on the bottom face 312. In one embodiment, the ground plane portion 320 is connected to a ground plane portion 315 on the top face 313 of the horizontal portion 325, including an extension portion of the ground plane that extends beyond the ground plane's regular rectangular shape. The ground plane portion 315 may be adapted through the extension for open-circuit tuning of high frequency operation. In one embodiment, the ground plane portion 315 ranges from 2 to 7 mm in width (i.e., horizontal dimension in FIG. 3b) and from 5 to 15 mm in length (i.e., vertical dimension in FIG. 3b).

In one embodiment, a connection 319 is included in co-planer relation to the ground plane portion 315 on the top face 313 of the first horizontal portion 325. The connection 319 may be capable of connecting with any suitable signal transmitter for the antenna, such as a coaxial cable connection. In one embodiment, the connection 319 forms a waveguide transmission line in relation with the ground plane portion 315 and/or the ground plane portion 320, including a length as described further herein.

In one embodiment, the transmission line of the connection 319 is connected to a capacitive stub 314 on the top face 313 of the first horizontal portion 325. The capacitive stub 314 may be capable of increasing bandwidth of lower frequency operation, such as providing capacitance between the capacitive stub and the ground plane portion 315 and/or between the capacitive stub and other grounded portions of the composite radiating structure, as described further herein. For example, the capacitive stub 314 may provide capacitance between the capacitive stub and a ground plane connection 318 on the horizontal portion 325. In one embodiment, the capacitive stub 314 ranges from 3 to 6 mm in width and from 5 to 12 mm in length. For example, in one embodiment, the position and/or shape (e.g., a polygon) of the capacitive stub 114 may be modified from those shown in FIG. 3b to create different effects on the impedance signal traces of the composite radiating structure.

In one embodiment, a ground plane connection 318 is provided between the ground plane portion 315 and a mounting pad 316. The ground plane connection 318 may be capable of controlling its impedance and coupling with both the mounting pad 316 and the radiating elements 303, 304 of the vertical portion 324. As described further herein, area(s) clear of metallization (e.g., area 317) on the substrate 309 of either the first and/or second horizontal portions 325, 326 or the vertical portion 324 of the composite radiating structure may be capable of adjusting efficiency and bandwidth of the composite radiating structure.

In one embodiment, one or both of the ground plane portion 315 and the ground plane portion 320 of the first horizontal portion 325 of the composite radiating structure may be capable of making room for circuitry, as described further herein.

FIG. 3c illustrates a second horizontal portion 326 of the composite radiator structure that is capable of being assembled in an orthogonal configuration with the vertical portion 324. In one embodiment, the second horizontal portion 326 may be capable of mounting to the first horizontal portion 325, as described further herein. In another embodiment, the second horizontal portion 326 may include mounting tabs 316 for directly connecting to the vertical portion 324 in an orthogonal configuration. The second horizontal portion 326 includes a front face 322 and a bottom face 321. A ground plane 323 may be included on the second horizontal portion 326, which may be capable of including circuitry disposed within and/or around the ground plane, as described further herein.

Figure 4A:
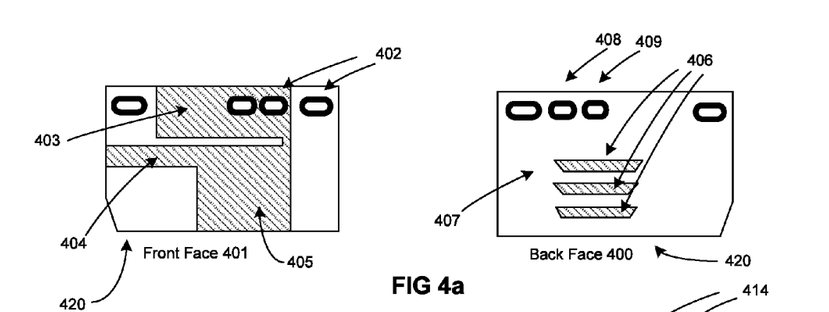
FIGS. 4a-c illustrate an embodiment of a composite radiator structure for assembly in an orthogonal configuration with a single vertical portion and three horizontal portions.
Figure 4B:
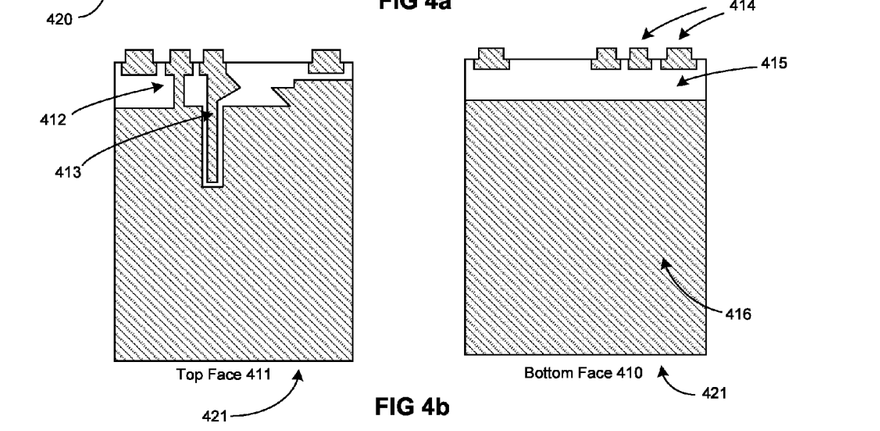
Figure 4C:
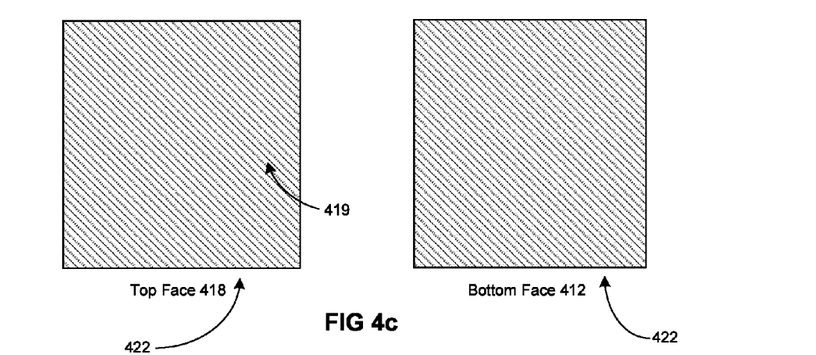

FIGS. 4a-c illustrate an embodiment of a composite radiator structure for assembly in an orthogonal configuration with a single vertical portion 420 and three horizontal portions 421, 422. FIG. 4a illustrates a vertical portion 420 of the composite radiator structure. FIG. 4b illustrates a first horizontal portion 421 of the composite radiator structure that is capable of being assembled in an orthogonal configuration with the vertical portion 420. FIG. 4c illustrates an additional horizontal portion 422 (such as a second, third, or fourth horizontal portion) of the composite radiator structure that is capable of being assembled in a non-planar (e.g., orthogonal) configuration with the vertical portion 420.

FIG. 4a shows an embodiment of a vertical portion 420 of the composite radiator structure, with a view of the front face 401 and the back face 400. In one embodiment, the vertical portion 420 includes through-holes 402, 408, 409 for assembling the vertical portion with the first horizontal portion 421 of the composite radiator structure. For example, through-holes 402, 408, 409 on the vertical portion 420 may be capable of accepting mounting pads 414 from the first horizontal portion 421. Through-holes 402, 408, 409 may be positioned and adapted for use both as physical support and connection as well as electrical connection, as described further herein. Connections between the vertical portion 420 and the first horizontal portion 421 may be adapted as described further herein. Each of the vertical portion 420 and the first and addition horizontal portions 421, 422 may include a substrate 407, as described further herein.

In one embodiment, the vertical portion 420 includes multiple radiating elements, each capable of radiating at and around a distinct radiating frequency, as described further herein. In one embodiment, metallizations on the vertical portion 420 may be adapted based on, for example, calculations of impedance between the vertical portion, the first horizontal portion 421, and the additional horizontal portion(s) 422, as well as the frequency requirements for the composite radiator structure.

In one embodiment, the vertical portion 420 includes a radiating element 403. The radiating element 403 may be adapted for higher frequency operation. In one embodiment, the radiating element 403 ranges from 1 to 6 mm in width and from 3 to 10 mm in length.

In one embodiment, the vertical portion 420 includes a radiating element 404. The radiating element 404 may be adapted for lower frequency operation. In one embodiment, the radiating element 404 ranges from 2 to 10 mm in width and from 5 to 45 mm in length.

In one embodiment, the vertical portion 420 includes a capacitive stub 405 connected to the radiating element 404. The capacitive stub 405 may be capable of tuning lower frequency operation, such as, for example, increasing lower frequency bandwidth. For example, in one embodiment, the position and/or shape (e.g., a polygon) of the capacitive stub 405 may be modified from those shown in FIG. 4a to create different effects on the impedance of the lower frequency signal traces of the composite radiating structure.

As one example, parasitic radiating elements 406, which are not connected electrically to either ground or signal portions of metallizations, may be included on the back face 400 as bandwidth-increasing parasitic radiating elements 406. Parasitic radiating elements 406 on the back face 400 may be positioned in spaced relationship with (e.g., flanking the planes of, at angle(s) to) the adjacent edges of the first and/or additional horizontal portions 421, 422.

FIG. 4b shows an embodiment of a first horizontal portion 421 of the composite radiator structure, with a view of the top face 411 and the bottom face 410. In one embodiment, as described further herein, the horizontal portion 421 includes mounting pads 414 for assembling the horizontal portion with the vertical portion 420 of the composite radiator structure. The first horizontal portion 421 may include a ground plane portion 416 on the bottom face 410. In one embodiment, the first horizontal portion 421 includes a ground plane portion 424 on the top face 411 that is substantially in a regular rectangular shape that does not include an extension portion.

In another embodiment, the ground plane portion 424 of the top face 411 includes an extension portion of the ground plane that extends beyond the ground plane's regular rectangular shape. The ground plane portion 424 may be adapted through the extension for open-circuit tuning of high frequency operation. In one embodiment, the ground plane portion 424 on the top face 411 ranges from 2 to 7 mm in width (i.e., horizontal dimension in FIG. 3b) and from 5 to 15 mm in length (i.e., vertical dimension in FIG. 3b). In one embodiment, the ground plane portion 416 is connected to a ground plane portion 424 of the horizontal portion 421, as described further herein.

In one embodiment, the transmission line of the connection 413 is connected to a mounting pad 414. In another embodiment, described further herein, the transmission line of the connection 413 is connected to a capacitive stub on the top face 411 of the first horizontal portion 421. The capacitive stub may be capable of increasing bandwidth of lower frequency operation, such as providing capacitance between the capacitive stub and the ground plane portion 424 and/or between the capacitive stub and other grounded portions of the composite radiating structure, as described further herein.

In one embodiment, a ground plane connection 412 is provided between the ground plane portion 424 and a mounting pad 414, may include a gap for capacitive coupling and/or DC rejection. The ground plane connection 412 may be capable of controlling its impedance and coupling with both the mounting pad 414 and the radiating elements 403, 404 of the vertical portion 420 helping the antenna to be matched at lower frequencies. As described further herein, area(s) clear of metallization on the substrate 407 of either the first and/or additional horizontal portions 421, 422 or the vertical portion 420 of the composite radiating structure may be capable of adjusting efficiency and bandwidth of the composite radiating structure.

In one embodiment, one or both of the ground plane portion 416 and the ground plane portion 424 of the first horizontal portion 421 of the composite radiating structure may be capable of making room for circuitry, as described further herein.

FIG. 4c illustrates an additional horizontal portion 422 (such as a second, third, or fourth horizontal portion) of the composite radiator structure that is capable of being assembled in a non-planar (e.g., orthogonal) configuration with the vertical portion 420. In one embodiment, the additional horizontal portion 422 may be capable of mounting to the first horizontal portion 421, as described further herein. In another embodiment, the additional horizontal portion 422 may include mounting tabs 414 for directly connecting to the vertical portion 420 in an orthogonal configuration. The additional horizontal portion 422 includes a top face 418 and a bottom face 417. A ground plane 419 may be included on the additional horizontal portion 422, which may be capable of including circuitry disposed within and/or around the ground plane, as described further herein.

Figure 5:
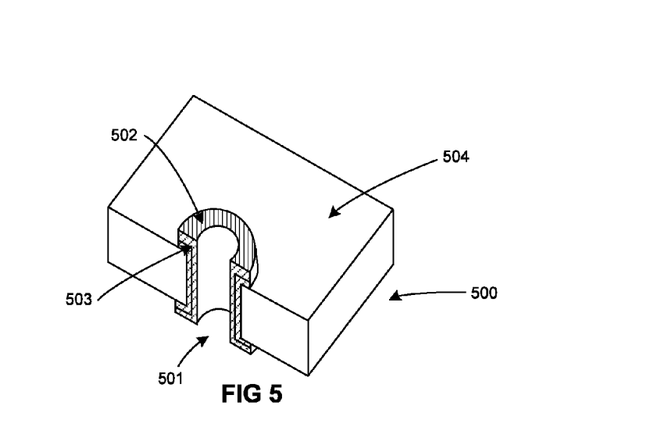
FIG. 5 illustrates a cross-sectional view of a through-hole showing the details for the through-hole as mechanism for assembly or integration.

FIG. 5 illustrates a cross-sectional view of a through-hole 500 described further herein. The cross-sectional view shows the details for the through-hole 500 within the substrate 504 as mechanism for assembly or integration of horizontal and vertical portions of a composite resonating structure. The through-hole 500 may include rounded portions 501, as shown and described further herein, as well as squared or notched portions. In one embodiment, the through-hole 500 includes two metallization layers, a first metallization layer 503 and a second metallization layer 502 plating or overlying the first metallization layer. The second metallization layer 502 may be capable of providing better properties for soldering a connection between the through-hole 500 and a mounting pad. For example, a vertical portion of a composite resonating structure may have a through-hole 500 that is adapted using one or more of the metallization layers 502, 503 to provide a solid mechanical and electrical connection between the vertical and horizontal portions.

II. Operation and Use of the Antennas

The antenna(s) within the composite resonating structure can be provided with a flexible cable adapted and configured to connect the antenna(s) to the electronics of the target device, such as a tracking system. Alternatively, the antenna(s) can be configured such that no cable is required to connect the antenna(s) to the target device. For a cable-less antenna, pads may be provided on the antenna(s) which provide connections from a module or transmission line via metal contacts or reflow solder.

The antenna can be affixed to a housing of a target device, such as an interior surface of a wireless device housing. Affixing the antenna can be achieved by using suitable double sided adhesive, such as 3M™ Adhesive Transfer Tape 467MP available from 3M.

As will be appreciated by those skilled in the art, the larger the antenna surface area (or volume), in general the higher the performance in terms of gain and radiation characteristics. Additionally, the gain of the antenna(s) is closely linked to the surface area or volume of the antenna(s. Thus, the larger the surface area or volume, the higher the gain. In deploying the antenna, clearances can be provided to optimize performance of the antenna. As will be appreciated by those skilled in the art, the larger the clearance, the better the radiation characteristics of the antenna.

III. Method of Manufacturing the Antennas

The features and functions of the antennas described herein allow for their use in many different manufacturing configurations. For example, in a wireless communication handheld device (e.g. a mobile phone), an antenna can be printed on any suitable substrate including, for example, printed circuit boards (PCB) or flexible printed circuits (FPC). The PCB or FPC is then used to mechanically support and electrically connect the antenna to the electronics of the device deploying the antenna through using conductive pathways, tracks or signal traces etched from copper sheets, for example, that have been laminated onto a non-conductive substrate. The printed piece can then be mounted either at the top of the handset backside or at the bottom of the front side of the handset. Thus, antennas according to this disclosure can be manufactured, for example, using a standard low-cost technique for the fabrication of a single-side printed circuit board. Other manufacturing techniques may be used without departing from the scope of the disclosure.

Techniques for manufacturing antennas include determining which materials and/or processes will be followed. For example, a printed circuit board (PCB), an electrically thin dielectric substrate (e.g., RT/diroid 5880), Flame Retardant 4 (FR-4) material complying with the UL-94-V0, or any suitable non-conductive board can be used as the substrate. A conductive layer is provided from which the antenna will be formed. The conductive layer is generally copper, but other materials can be used without departing from the scope of the disclosure. For example, aluminum, silver, chrome, and other metals or metal alloys can be used.

Data for identifying a configuration for the antenna layer is provided which can then be placed onto an etch resistant film that is placed on the conductive layer which will form the antenna. A traditional process of exposing the conductive layer, and any other areas unprotected by the etch resistant film, to a chemical that removes the unprotected conductive layer, leaving the protected conductive layer in place. As will be appreciated by those skilled in the art, newer processes that use plasma/laser etching instead of chemicals to remove the conductive material, thereby allowing finer line definitions, can be used without departing from the scope of the disclosure.

Multilayer pressing can also be employed which is a process of aligning the conductive material and insulating dielectric material and pressing them under heat to activate an adhesive in the dielectric material to form a solid board material. In some instances, holes can be drilled for plated through applications and a second drilling process can be used for holes that are not to be plated through.

Plating, such as copper, gold, or tin plating, can be applied to pads, traces, and drilled through holes that are to be plated through. The antenna boards can then be placed in an electrically charged bath of copper. A second drilling can be performed if required. A protective masking material can then be applied over all or select portions of the bare conductive material. The insulation protects against environmental damage, provides insulation, and protects against shorts. Coating can also be applied, if desired. As a final step, the markings for antenna designations and outlines can be silk-screened onto the antenna. Where multiple antennas are manufactured from a panel of identical antennas, the antennas can be separated by routing. This routing process also allows cutting notches or slots into the antenna if required.

As will be appreciated by those skilled in the art, a quality control process is typically performed at the end of the process which includes, for example, a visual inspection of the antennas. Additionally, the process can include the process of inspecting wall by cross-sectioning or other methods. The antennas can also be checked for continuity or shorted connections by, for example, applying a voltage between various points on the antenna and determining if a current flow occurs. The correct impedance of the antennas at each frequency point can be checked by connecting to a network analyzer.

IV. Kits

The antennas disclosed herein can be made available as part of a kit. The kit comprises, for example, a vertical portion of a composite resonating structure and one or more horizontal portions, as described further herein. Each portion may comprise a substrate having a substantially rectangular shape, a conductive layer attached to a first surface of the substrate wherein the conductive layer further comprises elements, as described further herein. Additionally, the kit may include, for example, suitable mounting material, such as 3M adhesive transfer tape. Other components can be provided in the kit as well to facilitate installation of the antenna in a target device. The kit can be packaged in suitable packaging to allow transport. Additionally, the kit can include multiple composite resonating structures, such that structures and associated connecting cables are provided as 10 packs, 50 packs, 100 packs, and the like.

V. Examples

Figure 6:
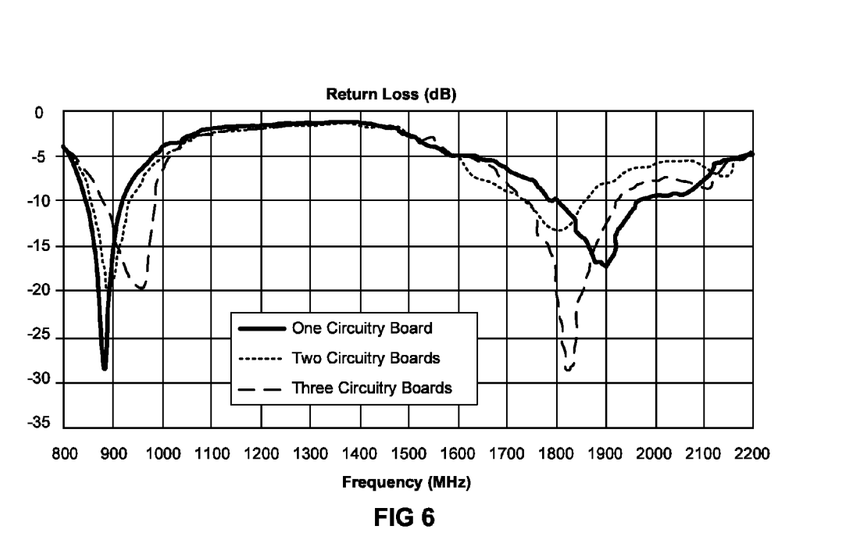
FIG. 6 shows measurements of return loss for three different embodiments of a composite gain structure, in a frequency range of 800 to 2200 MHz, the embodiments including respectively one, two, and three horizontal portions.
Figure 7:
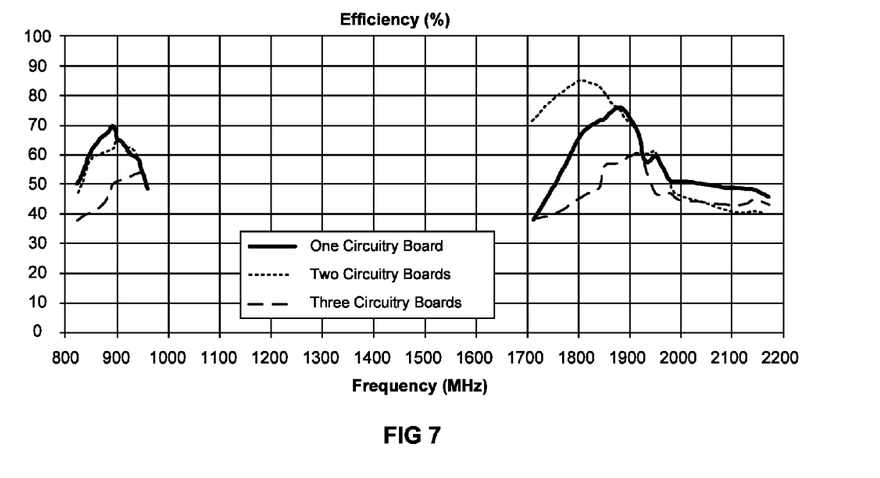
FIG. 7 shows measurements of efficiencies of three different embodiments of a composite gain structure, in a frequency range of 800 to 2200 MHz, the embodiments including respectively one, two, and three horizontal portions.
Figure 8:
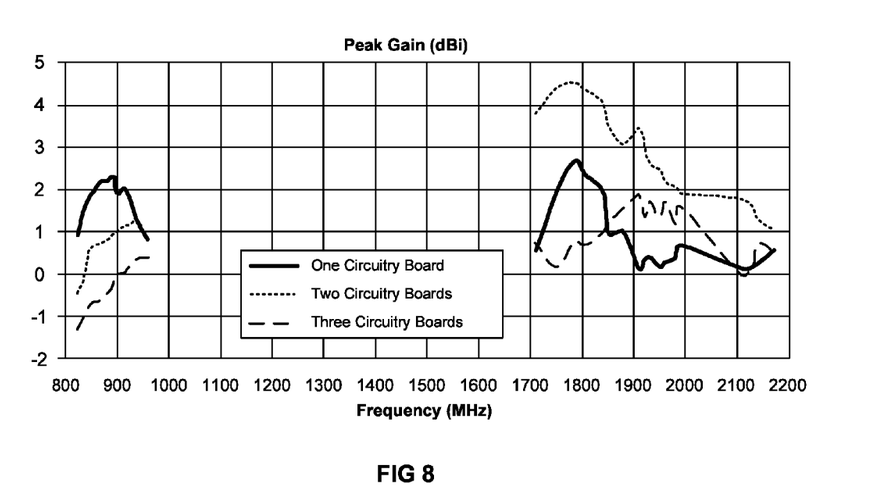
FIG. 8 shows measurements of peak gain for three different embodiments of a composite gain structure, in a frequency range of 800 to 2200 MHz, the embodiments including respectively one, two, and three horizontal portions.

Experimental antennas according to this disclosure have been constructed and tested. FIGS. 6-8 show exemplary embodiments of an actual measured return loss, an efficiency, and a peak gain, respectively, in a frequency range of 800 to 2200 MHz, for embodiments of a composite gain structure as described further herein. FIG. 6 shows measurements of return loss for three different embodiments of a composite gain structure, in a frequency range of 800 to 2200 MHz, the embodiments including respectively one, two, and three horizontal portions. FIG. 7 shows measurements of efficiencies of three different embodiments of a composite gain structure, in a frequency range of 800 to 2200 MHz, the embodiments including respectively one, two, and three horizontal portions. FIG. 8 shows measurements of peak gain for three different embodiments of a composite gain structure, in a frequency range of 800 to 2200 MHz, the embodiments including respectively one, two, and three horizontal portions. The return loss, efficiency and peak gain for each composite gain structure centers around the 850-900 MHz and 1800-1900 MHz band, but also includes sufficient performance in the 2100 MHz band. For example, the 2100 MHz band may have a center frequency from about 2110 MHz to 2200 MHz.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A composite resonating antenna structure comprising:
   a first substrate having a through-hole and a first conductive layer comprising a first resonating element connected to the through-hole;
   a second substrate having a mounting pad capable of connecting with the through-hole in a configuration such that the first substrate and the second substrate are in an orthogonal configuration; and
   a second conductive layer attached to the second substrate, the second conductive layer shaped to include a ground plane section and a signal transmission line capable of carrying microwave frequency signals including a center frequency;
   wherein the first resonating element is capable of radiating a frequency equal to the center frequency based on the orthogonal configuration.

2. The composite resonating antenna structure of claim 1 wherein the first resonating element is capable of having the resonant frequency equal to the center frequency further based on an electromagnetic field pattern between the first resonating element of the first substrate and the second conductive layer of the second substrate.

3. The composite resonating antenna structure of claim 2 wherein the first resonating element has a width of from about 1 mm to about 6 mm and a length of from about 3 mm to about 18 mm.

4. The composite resonating antenna structure of claim 2 wherein the first resonating element has a width of from about 2 mm to about 10 mm and a length of from about 5 mm to about 45 mm.

5. The composite resonating antenna structure of claim 2 wherein the electromagnetic field pattern is between the first resonating element of the first substrate and the ground plane section of the second conductive layer.

6. The composite resonating antenna structure of claim 1 wherein the resonant frequency is a first radiating frequency, wherein the center frequency is a first center frequency, and wherein the first conductive layer further comprises a second resonating element capable of radiating a second frequency equal to a second center frequency.

7. The composite resonating antenna structure of claim 6 wherein the second resonating element has a width of from about 1 mm to about 6 mm and a length of from about 3 mm to about 18 mm.

8. The composite resonating antenna structure of claim 6 wherein the second resonating element has a width of from about 2 mm to about 10 mm and a length of from about 5 mm to about 45 mm.

9. The composite resonating antenna structure of claim 6 wherein the first center frequency is between about 850 MHz and 900 MHz and the second center frequency is between about 1800 MHz and 1900 MHz.

10. The composite resonating antenna structure of claim 9, further comprising a third center frequency between about 2110 MHz and 2200 MHz.

11. The composite resonating antenna structure of claim 1 wherein the orthogonal configuration is a first orthogonal configuration, and wherein the ground plane section is a first ground plane section, the composite resonating antenna structure further comprising a third substrate including a second ground plane section capable of being disposed in a second orthogonal configuration with respect to the first substrate.

12. The composite resonating antenna structure of claim 11 wherein the first resonating element is capable of having the radiating frequency equal to the center frequency further based on an electromagnetic field pattern between the first resonating element of the first substrate and second ground plane section of the third substrate.

13. The composite resonating antenna structure of claim 11 wherein the second orthogonal configuration is further parallel to the second substrate.

14. The composite resonating antenna structure of claim 1 wherein the second conductive layer includes a connector for coupling with a coaxial cable.

15. The composite resonating antenna structure of claim 1 wherein the second conductive layer a capacitive stub portion attached to the signal transmission line on the second substrate.

16. The composite resonating antenna structure of claim 1 wherein the mounting pad is capable of fitting within the through-hole and form a connection therein.

17. The composite resonating antenna structure of claim 16 wherein the mounting pad is further capable of forming a connection with the through-hole via solder connection.

18. The composite resonating antenna structure of claim 16 wherein the through-hole has multiple metallizations within the first substrate.

19. An antenna kit comprising:
   a plurality of substrates include a plurality of resonating elements;
   a first substrate of the plurality of substrates having a through-hole and a first conductive layer comprising a first resonating element connected to the through-hole;
   a second substrate of the plurality of substrates having a mounting pad capable of connecting with the through-hole in a configuration such that the first substrate and the second substrate are in an orthogonal configuration; and
   a second conductive layer attached to the second substrate, the second conductive layer shaped to include a ground plane section and a signal transmission line capable of carrying microwave frequency signals including a center frequency;

wherein the first resonating element is capable of having a radiating frequency equal to the center frequency based on the orthogonal configuration.

20. The kit of claim 19 further comprising a flexible cable adaptable to connect the planar antenna to a target device.

\* \* \* \* \*